United States Patent [19]
Ho

[11] Patent Number: 6,158,040
[45] Date of Patent: Dec. 5, 2000

[54] ROTATED DATA-ALIGMNENT IN WADE EMBEDDED DRAM FOR PAGE-MODE COLUMN ECC IN A DVD CONTROLLER

[75] Inventor: Son Hong Ho, Los Altos, Calif.

[73] Assignee: NeoMagic Corp., Santa Clara, Calif.

[21] Appl. No.: 09/182,345

[22] Filed: Oct. 29, 1998

Related U.S. Application Data

[63] Continuation-in-part of application No. 09/124,334, Jul. 29, 1998, and a continuation-in-part of application No. 09/124,332, Jul. 29, 1998.

[51] Int. Cl.[7] .......................... G11C 29/00; H03M 13/00
[52] U.S. Cl. ............................... 714/770; 714/5; 714/18; 714/784; 714/785; 360/48; 365/51; 365/189.01; 341/94
[58] Field of Search ................................. 714/770, 5, 15, 714/18, 48, 52, 746, 755, 758, 766, 769, 777, 784, 785; 360/48, 53; 365/51, 52, 63, 189.01; 710/2, 29, 52, 129; 341/94

[56] References Cited

U.S. PATENT DOCUMENTS

| | | | |
|---|---|---|---|
| 3,745,526 | 7/1973 | Hong et al. | 714/777 |
| 4,564,945 | 1/1986 | Glover et al. | 714/769 |
| 5,027,357 | 6/1991 | Yu et al. | 714/758 |
| 5,220,569 | 6/1993 | Hartness | 714/758 |
| 5,517,509 | 5/1996 | Yoneda | 714/785 |
| 5,535,327 | 7/1996 | Verinsky et al. | 714/5 |
| 5,559,983 | 9/1996 | Masood | 711/112 |
| 5,581,715 | 12/1996 | Verinsky et al. | 710/129 |
| 5,650,955 | 7/1997 | Puar et al. | 365/51 |

OTHER PUBLICATIONS

"DVD Demystified", Jim Taylor, McGraw–Hill, 1997, pp. 120–136.

*Primary Examiner*—Emmanuel L. Moise
*Attorney, Agent, or Firm*—Stuart T. Auvinen

[57] ABSTRACT

A digital-versatile disk (DVD) playback-controller integrated circuit (IC) writes data to a block in an embedded DRAM memory. The memory block has rows and columns. Data read from a DVD optical disk is read in row order. Rather than write the DVD data across the rows in the memory block, the DVD data is accumulated into 16-byte words, and successive 16-byte words are written down a column in the memory block. Each row from the DVD disk is written to a 16-byte-wide column in the memory block. The embedded DRAM has a wide 16-byte interface, so all 16 bytes in a word are written during a single memory-access cycle. All the bytes in the memory block must be read in column-order for column-syndrome generation. Since the row-column ordering is reversed, the column-syndrome generator reads bytes across the memory-block rows. Most of these fetches are DRAM page hits, so access speed is improved for column-syndrome generation. Row syndromes can be generated on-the-fly as the data is written from the DVD disk to the memory buffer. Row syndrome generation thus requires no memory access cycles. The final accumulated syndromes are output to an error corrector that detects, locates, and corrects any errors in the columns.

20 Claims, 8 Drawing Sheets

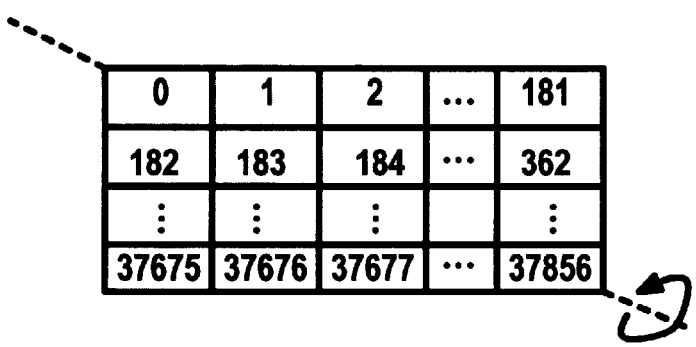
FIG. 6
FIG. 7
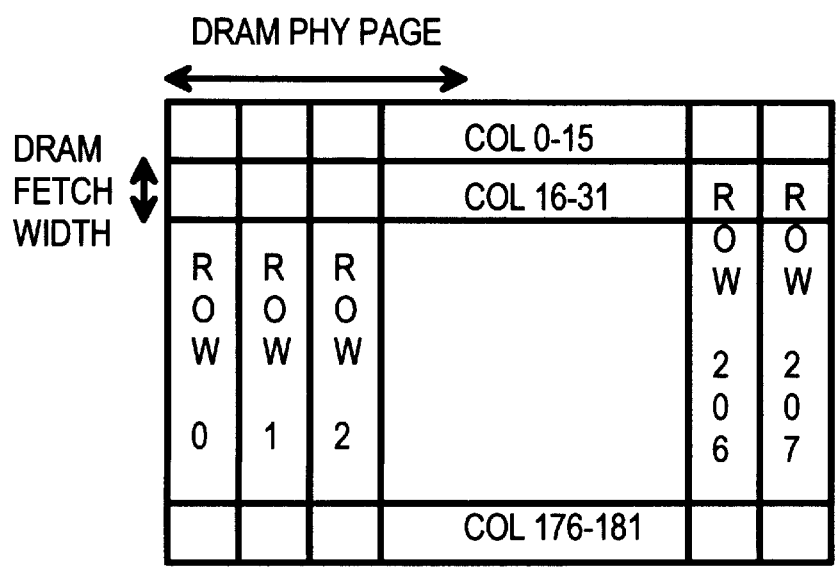
FIG. 8

ROTATED DATA-ALIGMNENT IN WADE EMBEDDED DRAM FOR PAGE-MODE COLUMN ECC IN A DVD CONTROLLER

RELATED APPLICATIONS

This application is a continuation-in-part of the co-pending applications for "Dual-Column Syndrome Generation for DVD Error Correction Using an Embedded DRAM", U.S. Ser. No. 09/124,334, filed Jul. 29, 1998 and "DVD Controller with Embedded DRAM for ECC-Block Buffering" U.S. Ser. No. 09/124,332, filed Jul. 29, 1998.

FIELD OF THE INVENTION

This invention relates to optical-disk systems, and more particularly to data storage organization for error correction during digital-versatile disk (DVD) playback.

BACKGROUND OF THE INVENTION

Next-generation optical disks known as digital-versatile disks (DVDs) have recently appeared. The CD-ROM drives on laptop and desktop PCs are being replaced with DVD drives. DVD has a much higher storage capacity than CD-ROM, enough that an entire motion picture can fit on a single DVD disk.

The large amount of data read during playback and the low-cost reproduction methods of optical disks increases the likelihood of encountering at least some errors on playback. Error detection and correction is thus important for CD-ROM's and DVD's. Smaller amounts of data such as stored in dynamic RAM memory often use parity—a bit is added to each data word so that the expanded word always has even or odd parity. Data from CD's and DVD's are arranged into larger blocks that have error-correction information appended. Multiple error-correction bytes allow errors to not only be detected, but also located and corrected.

FIG. 1 illustrates a DVD data block with error correction for both rows and columns. Data from DVD disk 18 is read sequentially and stored in a block of data. As the data is read from DVD disk 18, it begins filling row 0 with data bytes 1, 2, 3 . . . until 182 bytes have been read. Error-correction information (ECC) for row 0 is contained in the last ten bytes of the row. Data from DVD disk 18 then begins filling the second row (row 1) with data bytes 173, 174, etc. until a second row of 172 data bytes and 10 ECC bytes has been transferred. Additional ECC bytes for the second row are contained in the last 10 bytes of row 1.

Subsequent rows of data and row-ECC information are read from DVD disk 18 and stored in a buffer memory block until all 192 rows of data have been transferred. Finally, sixteen rows of ECC bytes are read. ECC bytes in the final 16 rows are error-correction bytes for columns of data. For example, the first ECC byte in each of the last 16 rows is for column 0, which includes data byte 1 from row 0, data byte 173 from row 1, . . . , and data byte 32681 for data row 191, a total of 192 data bytes, each from a different row.

The final ten bytes of each row in the final 16 rows contains ECC information for the final 16 rows of column ECC bytes. This ensures that errors in the column ECC bytes can be detected and corrected.

Row and Column ECC

The ECC bytes at the end of a row can be used to detect, locate, and correct one or more errors within the row, but do not contain information on errors in other rows. Sometimes errors are too numerous to be detected or corrected in a row. Then the column ECC bytes can be used to find and correct the errors that are uncorrectable by the row ECC bytes. The ECC bytes at the bottom of a column are used to detect, locate, and correct one or more errors within the column, but do not contain information on errors in other columns. Column ECC provides a redundancy to error correction, allowing more difficult errors to be corrected.

Often the data and ECC bytes from the DVD disk are stored in a temporary buffer such as a static RAM buffer. Rows and columns are read to generate syndromes for each row and for each column. Syndromes are signatures or checksums formed by using a pre-defined mathematical operator on all data bytes and ECC bytes of a row or column. Polynomial operators are often used.

The syndromes are then compared to a pre-defined signature of zero to detect any errors in the row or column. The syndromes can often be used to locate and correct a detected error. Complex algorithms such those based on Reed-Solomon code are used with the ECC bytes as is well-known in the art.

Multi-Byte Fetch for Row-Syndrome Generation—FIG. 2

FIG. 2 highlights that multiple bytes can be fetched from buffer memory for row syndrome generation. A syndrome for a row is generated by "summing" all the data and ECC bytes for a row. This "summing" is not a standard addition, but rather a complex signature-generating operation of scaling and adding the 182 bytes in a row. Multiple cycles can be used, such as by adding one byte per cycle to a running scaled sum.

Syndrome generator 10 performs the signature-generating operation as the bytes from the row are input. The buffer memory containing the data block often can read out multiple bytes per cycle. Thus FIG. 2 shows four-byte reads. In a first cycle, bytes 1, 2, 3, 4 are read from the buffer memory and operated on by syndrome generator 10. In a next memory cycle, data bytes 5, 6, 7, 8 are read from memory and accumulated by syndrome generator 10, adjusting the syndrome. Each successive memory cycle can read four bytes at once when the buffer memory is a standard 32-bit memory.

Once all 172 data bytes have been read and accumulated by syndrome generator 10, then the final 10 ECC bytes are read and accumulated. The final accumulated value in syndrome generator 10 is the row syndrome for the current row. Once the row syndrome is latched, syndrome generator 10 is cleared and the process repeated for next row.

The buffer memory can be physically written in the order shown for FIG. 1, although the row length of the physical memory can differ from that of the data block. Of course, the data and ECC bytes must be written into the buffer memory in order so that the adjacent bytes are for the same row. Otherwise, the four bytes read might not be for the same row.

Single-Byte Fetch for Column Syndrome Generation—FIG. 3

While multi-byte fetches improve row-syndrome performance, column syndromes are not able to benefit from multi-byte fetching. FIG. 3 highlights that column-syndrome generation uses inefficient single-byte fetches.

For column-syndrome generation, all of the bytes in a column are fetched from the buffer memory and input to syndrome generator 10. Only one byte from each row is needed. For column 0, byte 1 of row 0 is 1 fetched and input to syndrome generator 10. Since four bytes are always read, bytes 2, 3, 4 are also read, but not needed.

In the following memory cycle, data byte 173 is read from row 1, along with bytes 174, 175, 176. Only byte 173 is input to syndrome generator 10; fetched bytes 174, 175, 176 are discarded. For each succeeding row, one byte (at column 0) is read and input to syndrome generator 10, while three bytes are fetched and discarded (for columns 1, 2, 3).

Finally the last data byte 32,675 is read from row 191. Then during the next 16 memory cycles the 16 ECC bytes for column 0 are read and input to syndrome generator 10. After the last ECC byte has been read and accumulated by syndrome generator 10, the output from syndrome generator 10 is the column syndrome for column 0. The column syndrome can be latched, syndrome generator 10 cleared, and the process repeated for the second column. Then the second byte is input to syndrome generator 10 and the first, third, and fourth bytes discarded from each 4-byte fetch.

A total of 208 memory access cycles are required to fetch one byte from each of the 208 rows for column-syndrome generation. Using moderately wider fetches does not help, since adjacent bytes in a column are 182 bytes apart in the physical memory, separated by an entire row.

Since the data and ECC bytes are typically loaded into the buffer memory in row order, accessing just one byte from each row cannot take advantage of multi-byte fetching of wide memories. The adjacent column bytes are not physically adjacent to each other in the buffer memory. Wide memories fetch the multiple bytes from the same row. Also, dynamic memories are often slower to access when changing the physical rows as is often necessary for fetching column data.

What is desired is a high-speed optical-disk playback system. It is desired to use an embedded DRAM buffer for error correction. Multi-byte fetches of a wide buffer memory are desirable as much as possible to improve memory efficiency and bandwidth available for other uses. A more efficient organization of the data in the embedded DRAM buffer is desired. It is desired to improve performance of column syndrome generation and fetching by improving data arrangement in the buffer memory.

SUMMARY OF THE INVENTION

A buffer is for buffering data from an optical disk to a host. The buffer a disk interface that is coupled to receive data from the optical disk and output data words. The data from the optical disk is arranged into disk blocks containing disk rows and disk columns.

A memory is coupled to receive the data words from the disk interface. It stores the disk blocks as memory blocks. Disk rows are stored in memory-block columns and disk columns are stored in memory-block rows.

A column-syndrome generator is coupled to the memory. It reads data in a disk column by reading a memory-block row from the memory. The column-syndrome generator outputs a column syndrome for the disk column and indicates when an error is present in the disk column. Thus memory-block rows are read to generate column syndromes.

In further aspects of the invention an accumulator in the disk interface accumulates a series of n bytes of data into a data word before writing to the memory. The memory includes a wide interface that is able to write n bytes to the memory in a single memory-access cycle. Thus the wide interface is used for writing data words from the optical disk to the memory.

The memory-block columns are n bytes in width, where data from the optical disk is written as n bytes to a first memory-block row, a next n bytes to a second memory-block row, and each following n bytes to one of a plurality of following memory-block rows. Each of the n bytes is written to a same n-byte wide memory-block column. Thus multiple bytes of data from the optical disk are written to each memory-block row.

In still further aspects the column-syndrome generator reads a single byte from each disk row using a separate memory-access cycle for each byte in the disk column. Thus the column-syndrome generator does not use all bytes of the wide interface.

In other aspects the memory is a dynamic random-access memory DRAM having a faster access time for a page-hit wherein a last access was to a same DRAM row as a current access than when the last access was a page-miss to a different DRAM row than the current access. Memory-access cycles for the disk interface are mostly page-miss cycles that are require more time than page-hit cycles, while memory-access cycles for the column-syndrome generator are mostly page-hit accesses. Thus page hits occur for column-syndrome fetching but not for disk-interface accesses.

In further aspects each memory-block row contains several DRAM pages. Page-hit cycle occur when fetching by the column-syndrome generator within a DRAM page, but a page-miss cycle occurs when the column-syndrome generator fetches from a new DRAM page. Thus memory-block rows contain several DRAM pages.

BRIEF DESCRIPTION OF THE DRAWINGS

FIG. 6 shows a straightforward arrangement of data in the embedded DRAM using row order.

FIG. 7 shows a column-ordered data arrangement.

FIG. 8 illustrates a wide-column rotated data arrangement that uses page mode for column access but the wide fetch width for row access.

DETAILED DESCRIPTION

The present invention relates to an improvement in memory management for DVD error-correction controllers.

The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
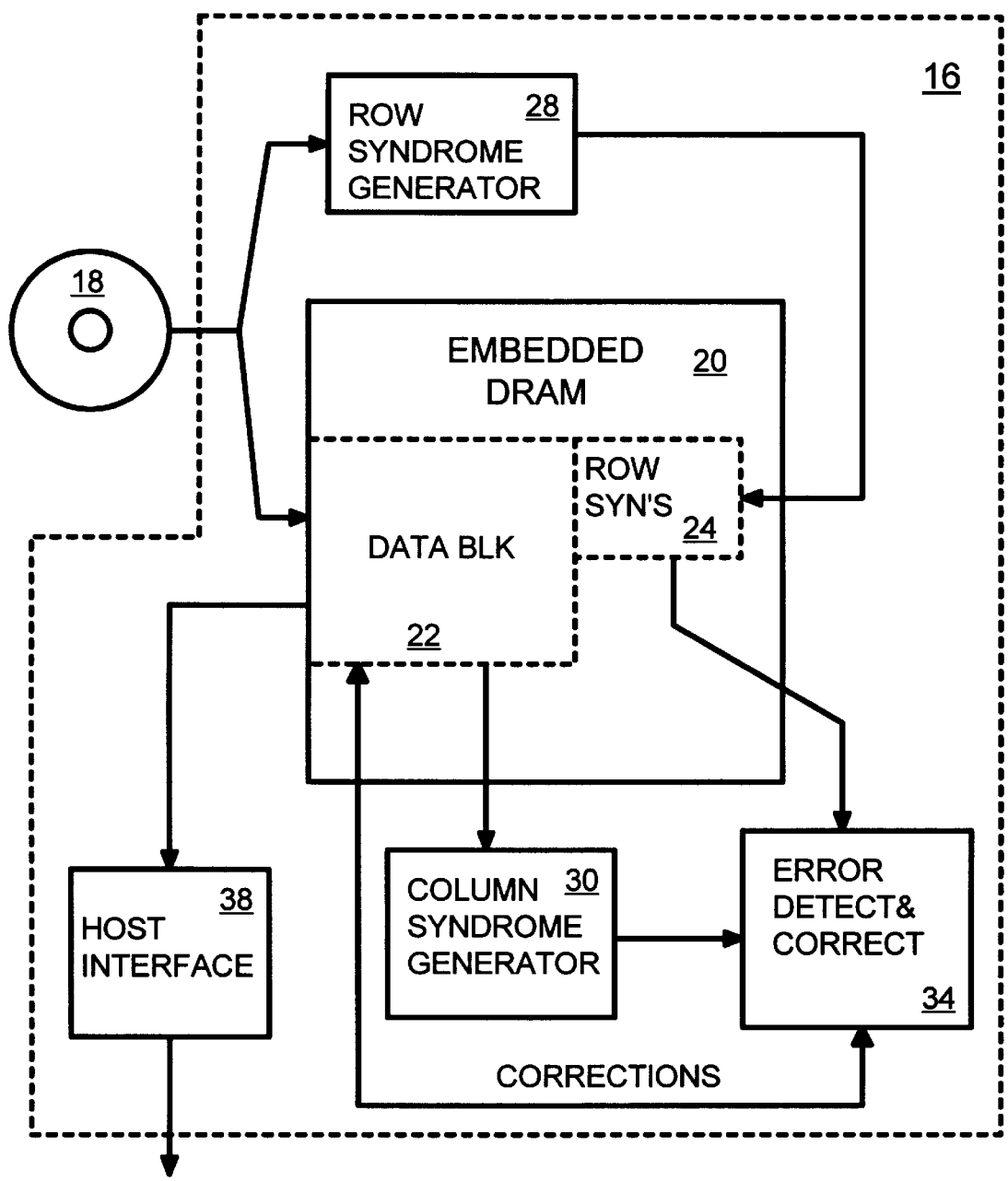
FIG. 4 is a diagram of a DVD controller chip with an embedded DRAM for the buffer memory.

DVD Controller with Embedded DRAM Buffer—FIG. 4

FIG. 4 is a diagram of a DVD controller chip with an embedded DRAM for the buffer memory. Embedded dynamic random-access memories (DRAMs) have been developed by the assignee and widely used in graphics accelerators for notebook personal computers. See for example, "Graphics Controller Integrated Circuit Without Memory Interface", U.S. Pat. No. 5,650,955.

Data is read from DVD disk 18 and into DVD controller chip 16. DVD controller chip 16 is an integrated circuit that may include a DVD controller that interfaces with the electronics of an external DVD disk player. The error correction and data paths of DVD controller chip 16 are shown in FIG. 4 while other portions are not shown.

Embedded DRAM 20 is a large 512-Kbyte memory array within DVD controller chip 16. Dynamic rather than static memory is used to allow for a much larger memory capacity. Since each data block 22 occupies at least 208×192 (37856 bytes including ECC), embedded DRAM 20 can hold 13 data blocks 22. As is shown later in FIG. 5, the large capacity of embedded DRAM 20 allows for pipelining of several data blocks, improving performance. A smaller SRAM memory would not have enough capacity for storing several data blocks in a pipeline. A refresh controller (not shown) refreshes the DRAM.

On-The-Fly Row Syndrome Generation

Data read from DVD disk 18 to DVD controller chip 16 is written to data block 22 in embedded DRAM 20. As each data byte is read into DVD controller chip 16, it is also sent to row syndrome generator 28. Row syndrome generator 28 generates ten row syndrome bytes for the current row being written to embedded DRAM 20 by accumulating each data and row ECC byte into registers storing the row syndrome. Once the last ECC byte in a row is written to embedded DRAM 20 and accumulated by row syndrome generator 28, the registers in row syndrome generator 28 are copied to embedded DRAM 20 and stored as the row syndrome for the row just written. Pointers are used to locate the current row syndrome being written in row syndrome storage 24 within embedded DRAM 20.

Row syndrome generator 28 is cleared as the next row of data and ECC bytes begins to be read from DVD disk 18. The row syndrome for the next row is generated as row syndrome generator 28 accumulates each byte as each byte is written into data block 22 of embedded DRAM 20. Once all data and ECC rows are written to data block 22, a new area of embedded DRAM 20 is set aside for the next data block. The data stream from DVD disk 18 is then written to rows in the next data block.

Generating the row syndrome as the data is being written to data block 22 of embedded DRAM 20 frees up memory bandwidth since no fetches are needed for row-syndrome generation of data block 22. Data and ECC bytes are simultaneously written to data block 22 of embedded DRAM 20 and to row syndrome generator 28.

Once at least one row of data block 22 has been transferred from DVD disk 18 to embedded DRAM 20, rows are checked for errors and error correction is attempted. Error detector and corrector 34 reads the first row's syndrome bytes from row-syndrome storage 24 of embedded DRAM 20 and compares each byte of the generated row syndrome to a predetermined syndrome of zero for all row syndromes. If the syndromes match, no error is detected and error detector and corrector 34 reads the next row's syndrome from row syndrome storage 24. Each of the ten bytes of a row syndrome must match zero. A non-zero syndrome byte indicates an error in the row.

When error detector and corrector 34 detects an error, error correction is attempted on the row. The location of the error or errors is determined using standard but complex techniques, such as solving a Euclidean Algorithm and Chien search using the generated row syndrome and initial conditions. The error location and the error value (difference) are solved for. See for example, U.S. Pat. No. 5,027,357 by Yu et al. which uses a Reed-Solomon code such as the X3B11 standard and U.S. Pat. No. 5,517,509 by Yoneda that describes decoding ECC and locating errors using Euclid's algorithm and a Chien search.

When error detector and corrector 34 successfully locates an error in the row, the row is corrected by performing a read-modify-write cycle at the location of the error within data block 22 in embedded DRAM 20. Many clock cycles of computation may be required to detect and correct errors. Some detected errors may not be correctable with only the row syndrome. A flag can be set when such uncorrectable errors are detected. The column syndromes are later used to attempt to correct these errors that are not correctable by the row syndromes.

Column Syndrome Generation After Row Corrections

Once the last row of data block 22 has been transferred from DVD disk 18 to embedded DRAM 20, and once error detector and corrector 34 has corrected all rows of data block 22, column syndromes are generated. It is necessary to wait for column-syndrome generation until all possible row corrections have been written to data block 22, since fewer errors will need to be corrected using the column syndromes.

Column syndrome generator 30 reads one or more columns of data from data block 22 and generates one or more column syndromes for the columns read. Since the data and ECC bytes are read from DVD disk 18 and written to embedded DRAM 20 in row order, the bytes in a column are separated by an entire row, 182 bytes. Since this is much larger than the width of the memory fetch, separate fetches are required for each byte in the column. Each of the column's bytes is in a separate row.

Using the dual-column syndrome generation highlighted in the parent application, two columns can be processed at the same time. Column syndrome generator 30 fetches one or more bytes from a row in data block 22 in each memory fetch cycle. The fetched bytes are accumulated into the syndromes for one or more columns, while the other fetched bytes are discarded. After fetches for all the rows of a column, the column syndromes are latched into error detector and corrector 34. Column syndrome generator 30 then fetches the next columns of data bytes, starting with row 0 of data block 22.

The column syndromes latched into error detector and corrector 34 are processed serially, since error detector and corrector 34 can only process one column at a time.

The first column syndrome is compared to an expected column syndrome. A mismatch detects an error in the column. The location of the error and the correction required are generated by error detector and corrector 34. The correction is made by a read-modify-write cycle to data block 22. Should a column error be uncorrectable, the entire data block can be re-read from DVD disk 18, or the host can be flagged.

Once all column syndromes have been generated, and all columns corrected, error correction is completed for data block 22. Host interface 38 transfers data block 22 to a host interface such as a PCI bus on a personal computer or an internal bus on a TV-set-top DVD player. Host interface 38 ignores the ECC bytes, transferring only the data bytes. Once all rows of data are transferred from embedded DRAM 20 to the host, data block 22 can be marked invalid and the storage area re-used for another data block from DVD disk 18.

Figure 5:
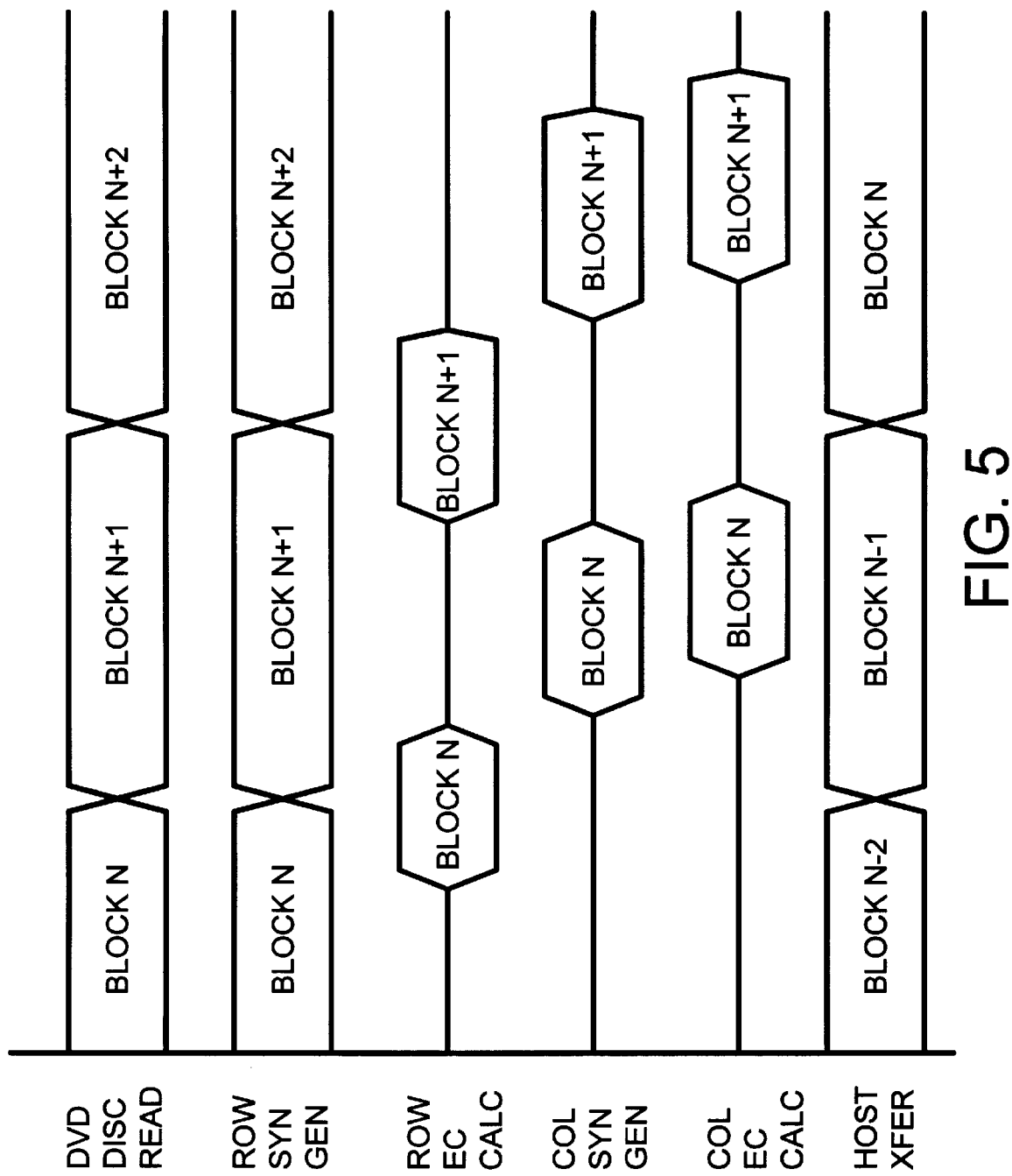
FIG. 5 illustrates the pipelining of blocks of DVD data during error detection and correction.

Pipelining of DVD Blocks—FIG. 5

FIG. 5 illustrates the pipelining of blocks of DVD data during error detection and correction. A DVD block has 208 rows each with 182 bytes, including ECC bytes. Data and ECC bytes for all 208 rows of DVD block N are read from the DVD disk and written to the embedded DRAM. As each row is read from the DVD disk and written to the embedded DRAM buffer, the row syndrome is generated. Thus all the row syndromes for DVD block N are generated at about the same time the data is read from the DVD disk.

The following DVD blocks N+1 and N+2 likewise are read from the DVD disk and written to the embedded DRAM while the row syndromes are generated and written to the embedded DRAM on the fly. This is shown by the upper two waveforms of FIG. 5.

Error detection and correction (EC) for the rows of DVD block N can begin once at least the first row has been written to the embedded DRAM. As shown in FIG. 5, EC calculations begin near the end of reading block N and continue through while the first rows of next block N+1 are read from the DVD disk. EC calculations require less time than does reading the block from the DVD disk, since reading from the optical DVD disk is relatively slow.

As the row EC calculations are performed, any detected errors are corrected by over-writing the faulty data in the embedded DRAM. Once all row corrections are completed, the partially-corrected DVD block in the embedded DRAM is read, column-by-column, for generating the column syndromes. After each pair of columns is read and its column syndromes generated and latched, the error detector and corrector calculates the error location and error value of any errors in each column. Corrections are written to the columns in the embedded DRAM. Since each column is corrected just after its syndrome is generated, all 182 column syndromes do not have to be stored at the same time. The column EC calculation waveform "COL EC CALC" overlaps the column syndrome generation "COL SYN GEN" waveform but is delayed by one pair of columns.

The error detector and corrector is first used for row error detection and correction for block N, and later used for column error detection and correction for the same clock N. The same error detector and corrector engine is used for both row and column corrections. Column error detection and correction does not occur until the next DVD block N+1 is being read from the DVD disk. The column syndromes for a block are generated while the next block's row syndromes are being generated. Thus row and column syndrome generation is pipelined.

Once all the column corrections are completed, the DVD block is clean and ready to be transferred to the host. Host transfer for DVD block N occurs while DVD block N+2 is being read from the DVD disk to the embedded DRAM. Thus each DVD block is pipelined for a period about equal to the read time for 2 DVD blocks.

Such a pipeline requires that up to 3 DVD blocks be stored in the embedded DRAM buffer, along with the row syndromes for about one and a half blocks. Each block is about 40 Kbytes, with overhead, so a total memory of 120 Kbytes is needed for the 3-block-deep pipeline. This is about a 1-megabit memory.

Rotation of Data Arrangement in Embedded DRAM— FIG. 6

FIG. 6 shows a straightforward arrangement of data in the embedded DRAM using row order. Since data comes off the disk in row order, data can be written into the DRAM in the same order received from the optical disk. As FIG. 6 shows, bytes 0, 1, 2, 3 up to 181 are received in order from the DVD optical disk and written to the first row of the memory block. Byte 182 is received from the optical disk after byte 181, but byte 182 begins the second row, which continues with bytes 183, 184, ... to byte 362. Row continue to be filled from left to right and then to the next row until the last row is written with bytes 37675, 37676, ... 37856.

This row order is useful since the data arrives in this order, and is often sent to the host in basically this order, with some modification. Even though the rows in the block do not have to exactly match the DRAM's physical rows, many of the accesses of bytes in the rows are in the same physical DRAM page, so faster page-mode access is possible for disk writes and host reads. The full width of the embedded DRAM can also be used, further increasing performance.

However, the problem of column reads for column-syndrome generation remains. Each column byte is in a different physical DRAM page, so column-wise access consists of many slow page-miss DRAM cycles.

The row-order data arrangement of FIG. 6 can be rotated or flipped about the dashed axis to produce a column-order data arrangement. FIG. 7 shows a column-ordered data arrangement. Data bytes written in from the optical disk are written down the columns of the block rather than across the rows. The data from the optical disk is still arranged into error-correction ECC blocks with rows and columns, but the ECC rows are written down columns in the DRAM block. These columns are virtual columns since the DRAM's physical rows can have different widths than the ECC rows and columns. The rows and columns of the ECC block are reversed when stored in the memory block, with ECC rows being stored as vertical columns and ECC columns located in DRAM rows.

As data bytes 0, 1, 2 ... 181 are received for the first ECC row, the are written down a column of the data block rather than across a row. Once the last byte in the first ECC-block row is received, byte 181, then the next byte begins the next column, byte 182. Additional bytes from the disk are written down the column of the memory block, and each new ECC row starts a new column, until the last ECC row is finished with byte 37856.

Since the ECC columns are now in DRAM rows, page-mode access can be used when reading successive bytes in a column. Thus column-syndrome fetching is improved, since page hits occur for the vast majority of bytes in the column being read. Since the wide access width of the embedded DRAM is also within a physical DRAM row, the wide interface of the embedded DRAM also increases column-wise fetching speed. For a 128-bit DRAM interface, each fetch reads 16 column bytes.

However, row-wise access is slowed considerable, since adjacent bytes in a row are in separate DRAM pages, resulting in page-miss cycles for all row accesses. The wide embedded-DRAM interface is not used for row access, since adjacent bytes in an ECC row are separated by 182 bytes, and the DRAM interface is only 16 bytes in width. Thus disk and host accesses are considerably slowed.

Wide-Column Rotated Arrangement—FIG. 8

The inventor overcomes these problems of row and column ordering by using a combined or hybrid ordering. The basic column-ordering of FIG. 7 is used, but with the ECC rows physically stored as 16-byte-wide columns. In FIG. 7 the ECC rows were stored as single-byte-wide columns. Column memory ordering is enhanced by storing groups of 16 bytes together, rather than just one byte.

FIG. 8 illustrates a wide-column rotated data arrangement that uses page mode for column access but the wide fetch width for row access. The first 16 columns are stored together in the first memory row. Each memory row contains 16 ECC columns rather than just one ECC column. Each ECC row is spread across 16 columns of the memory block.

Since the fetch width of the embedded DRAM is 16 bytes, the ECC-row-width is set to match the DRAM fetch width. As data arrives from the optical disk, the first 16 bytes are accumulated and then written to the DRAM in a single access cycle. Then the next 16 bytes are accumulated and then written in another DRAM access cycle, and so on. Groups of 16 bytes in the ECC row are written down the first 16 memory columns until all 182 bytes of the first row (row 0) are written in. Then the next ECC row is written down the next 16 memory columns in a similar fashion.

Row-wise access benefits from the wide embedded DRAM interface, but each successive memory access cycle is a row miss, not a DRAM page hit. Column-wise access benefits by using DRAM page-hit cycles, but can only access one of the column bytes per access cycle. Thus column-wise access benefits from page-hit cycles, but not from the wide DRAM interface. Even though the DRAM physical page may not match the data-block width, most of the ECC-column-access cycles are page hits. As FIG. 8 shows, the ECC columns are stored along the direction of the physical DRAM pages, but the ECC rows are stored along the DRAM fetch width.

Figure 9:
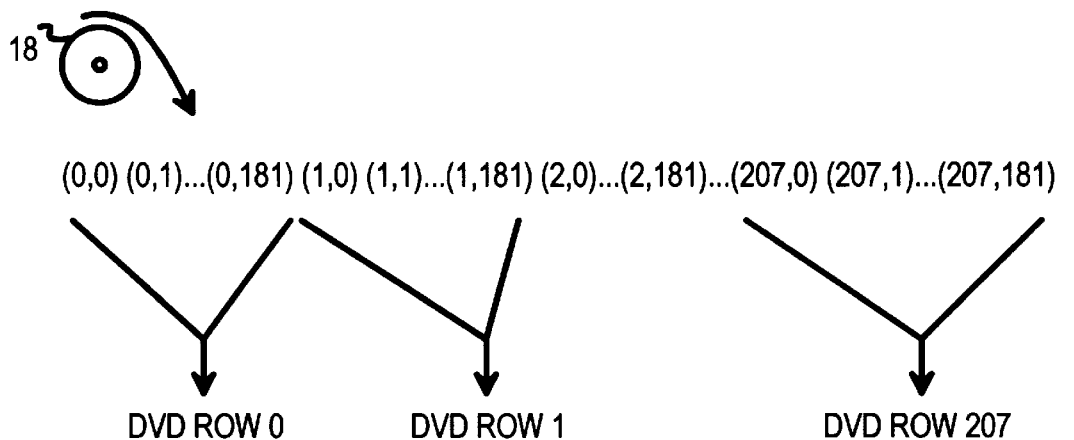
FIG. 9 shows in detail how data from the DVD disk is ordered in the memory block.

Columns Match DRAM Fetch Width—FIG. 9

FIG. 9 shows in detail how data from the DVD disk is ordered in the memory block. Data from DVD optical disk 18 is arranged into ECC blocks for error correction. The ECC blocks are read serially off of optical disk 18 as ECC rows of 182 bytes in each row. There are 208 rows in the ECC block. Each of the 182 bytes in an ECC row belongs to a different ECC column. Thus there are 208 ECC rows and 182 ECC columns in an ECC block. Data is read from optical disk 18 in row order rather than column order.

In FIG. 9, a (row,column) notation is used to indicate the ECC row and ECC column a byte belongs to. The first data in an ECC block read from optical disk 18 belong to row 0, and are designated (0,0), (0,1), (0,2), etc. The last byte in the first ECC row is (0,181), while the first byte in the second ECC row is (1,0). The last ECC row read from disk 18 is row 207, that starts with bytes (207,0), (207,1), and ends with byte (207,181), which is the final byte in the ECC block.

The first 16 bytes (0,0), (0,1), . . . (0,15) of the first ECC row are accumulated from disk 18 and then written as the first 16 bytes of the first row of memory data block 22. Next, the following 16 bytes (0,16), (0,17), . . . (0,31) are accumulated from optical disk 18 and written into the first 16 bytes of the second memory row of data block 22. Each 16-byte write uses one DRAM access cycle since the fetch/write width of the wide embedded DRAM is 16 bytes.

After a total of 11 DRAM access cycles, each writing 16 bytes from optical disk 18, a total of 176 (11×16) bytes have been written, to byte (0,175). The final 6 bytes (0,176), (0,177), . . . (0,181) are accumulated from the reading of optical disk 18 and then written to the first 6 bytes of the last memory row of data block 22. The other 10 bytes of the 16-byte DRAM width are not used and can be written with arbitrary data.

The first ECC row, row 0, is thus written down the first 16-byte-wide column of data block 22. A total of 12 DRAM access cycles were required. The next ECC row is written in the same way, but to the next 16-byte-wide column of data block 22. Bytes (1,0), (1,1), (1,2), . . . (1,15) are accumulated and written to second group of 16 bytes in the first memory row, adjacent to byte (0,15) of the first ECC row. After 12 DRAM access cycles, the second ECC row has been written to data block 22. Other ECC rows are also written down 16-byte-wide columns of data block 22, until the final row 207 is written, with bytes (207,0), (207,1), . . . (207,15) written to the first memory row, and bytes (207,176), (207, 177), . . . (207,181) written to the last memory row.

Figure 10:
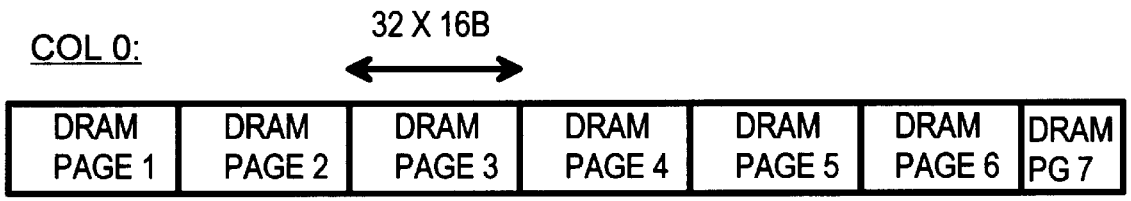
FIG. 10 illustrates that reading a column of the ECC block is accelerated by using DRAM page mode.

Fetch for Column Syndrome Accelerated by Page Mode—FIG. 10

FIG. 10 illustrates that reading a column of the ECC block is accelerated by using DRAM page mode. After row syndromes have been generated and row errors corrected, the corrected bytes in a column are read and sent to the column-syndrome generator. Each column has 208 bytes. Although the embedded DRAM can fetch 16 bytes per access cycle, the 16 bytes are in the same ECC row and thus belong to 16 different columns, not the same column. Thus only one column byte can be fetched per DRAM access cycle.

Adjacent bytes in an ECC column are spaced 16 bytes apart, due to the 16-byte write of the row data from the optical disk. Each of the 208 bytes in a column are fetched in separate DRAM access cycles, with the address incrementing by 16 for each access cycle.

DRAM page sizes vary, but are generally several Kbits in size. For example, the embedded DRAM may have a page size of 32×16 bytes, or 512 bytes (4K bits). Every 32 adjacent and aligned accesses are in the same DRAM page. In FIG. 10, the first 32 bytes in column 0 are fetched in 32 access cycles. After an initial page miss, then next 31 accesses are page hits in DRAM page 1. Page hits have about one-third the access time of a page miss, although this varies.

The 33$^{rd}$ column byte is in DRAM page 2, and thus a page miss cycle occurs. Then the following 32 accesses are page hits in DRAM page 3, before the 65$^{th}$ column byte causes a page miss when crossing into DRAM page 3. A total of six and one-half DRAM pages store the 208 column bytes. Each of the seven pages begins with a page miss, but the remaining 31 accesses (15 in page 7) are page hits. Thus only 7 out of 208 accesses are page misses, assuming the column fetching is not interrupted by another requester or a DRAM refresh. About 97% of the column accesses are page hits.

Column 1 uses the other half of DRAM page 7, and then the next six DRAM pages, including all of DRAM page 13. The first byte in column 1 may be a page hit, since DRAM page 7 was already opened by column 0 fetching. Only 6 page misses occur in column 1. Thus an average of 6.5 page miss cycles occurs for each column fetched for syndrome generation. Of course, other activity such as disk or host buffering for other blocks may win arbitration of the embedded DRAM, causing additional page miss cycles when column-syndrome fetching resumes.

Figure 11:
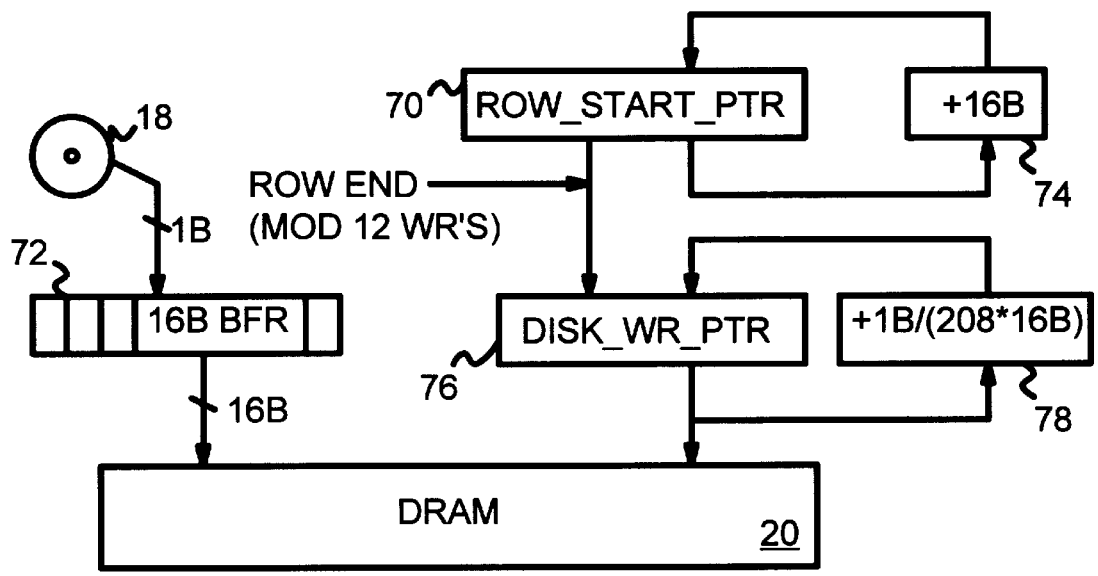
FIG. 11 shows how addresses are generated for writing data bytes from the DVD optical disk to the columns in the embedded DRAM.

Row-Wise Address Generator for Writes from Disk—FIG. 11

FIG. 11 shows how addresses are generated for writing data bytes from the DVD optical disk to the columns in the embedded DRAM. The addresses generated are a sequence for storing data arriving in the order of the ECC rows, but are stored along the wide columns of the data memory block. The address generated sequences down the wide column to store the ECC row in the vertical (column) direction. Once address is needed for each memory access cycle, but each memory access cycle stores 16 bytes, or 10 bytes for the last access in the ECC row.

Data read from DVD optical disk 18 is demodulated and converted from 16-bit codewords stored on the optical disk to bytes. These bytes arrive serially and are stored in accumulator register 72 until a group of 16 bytes have been received. The 16 bytes from accumulator register 72 are written together into embedded DRAM 20. Accumulator 72 can be extended in depth to provide additional buffering, allowing embedded DRAM 20 to stay busy for a longer period of time.

The address where in embedded DRAM 20 the 16 bytes from accumulator register 72 are written is the disk-write pointer DISK_WR_PTR stored in pointer register 76. The starting address of the ECC block, which is the address to store the first byte of the first ECC row, is loaded into start register 70 as ROW_START_PTR by memory-management firmware. This starting pointer is initially copied to pointer register 76. This is the first address, used for the first memory access cycle when the first 16 bytes are written into embedded DRAM 20.

After the first access, the address for the second access is generated. The pointer from pointer register 76 is increased in value by 208*16 bytes by adder 78. Since each ECC column and memory-block row has 208 bytes, increasing the pointer by 208*16 moves the write pointer to the next memory row. The next 16 bytes from accumulator register 72 are written immediately below the first 16 bytes, in the second memory row of the data block.

For the third write, the pointer from pointer register 76 is again increased in value by 208*16 bytes by adder 78. This moves the write pointer to the third memory row. The third group of 16 bytes from the ECC row and accumulator register 72 are written immediately below the second 16 bytes, in the third memory row of the data block.

The write pointer is increased by 208*16 bytes for each successive 16-byte write cycle, until the last of the 182 ECC-row bytes is written. Only a 10-byte write is performed for the last access since the ECC row's length is not a multiple of 12. A total of 12 write cycles are required for the ECC row.

At the end of the ECC row, the memory-block column has been written and the write pointer needs to be moved to the top of the second column in the memory block. The second ECC row is to be written to the second memory-block column. The second memory-block column begins 16 bytes from the beginning of the first memory-block column, since each column is 16-bytes wide.

The starting pointer from start register 70 is incremented by 16 bytes using adder 74 to generate the next column's starting address. This add operation can occur before the end of the first column so that the next column's starting address is ready ahead of time. At the end of the first ECC row, after 12 memory-access cycles, the starting address of the next column from start register 70 is copied to pointer register 76. The next 16 bytes from accumulator register 72 are then written to the top of the second memory-block column. Adder 78 increases the write pointer by 208*16 bytes for each memory access, causing each successive 16 bytes to be written below the previous 16 bytes in the column. Thus the next ECC row is written in 16-byte groups down the wide memory-block column.

The start pointer from start register 70 is again increase by 16 bytes during the writing of the second ECC row, so that the start pointer in start register 70 points to the top of the third column. After another 12 memory accesses (24 from the beginning of the ECC block read from optical disk 18), the starting pointer from start register 70 is again copied to pointer register 76 to reset the pointer to the top of the third column in the memory block. The third ECC row is then written down the third column.

This process continues for each of the 208 ECC rows until all 208 columns in the memory block have been written. Then the starting pointer in start register 70 can be loaded with a starting address for storing another ECC block from disk to embedded DRAM 20.

Figure 12:
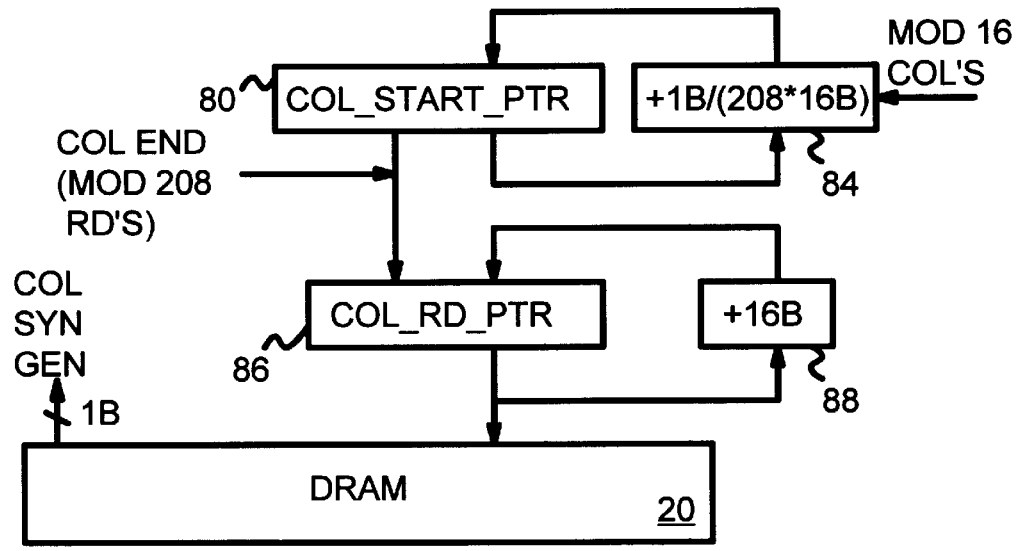
FIG. 12 shows how addresses are generated for reading data bytes in ECC-column order by reading rows in the embedded DRAM.

Column-Wise Address Generator for Syndrome Generation—FIG. 12

FIG. 12 shows how addresses are generated for reading data bytes in ECC-column order by reading rows in the embedded DRAM. The addresses generated are a sequence for reading data in the order of the ECC columns, but are stored across rows of the memory block.

Firmware loads the starting address of the ECC block into start register 80. This is initially the same as the starting address for row-address sequencing of FIG. 11, but later diverges. The initial starting address from start register 80 is copied to pointer register 86 and is used to read the first byte of the first ECC column. The second byte of the first ECC column is located in the second ECC row, 16 bytes later in the first row. Adder 88 increases the read pointer in pointer register 86 by 16 so that the second fetch points to the second byte in the ECC column.

The address of the third byte in the ECC column is generated by again adding 16 bytes to the read pointer from pointer register 86. Each successive ECC column byte is 16 bytes farther to the right in the DRAM row. Several physical DRAM rows may be needed for one memory-block row, as was described for FIG. 10. All of the byte in the ECC column are in the first memory-block row.

A total of 208 memory-access cycles are required to read all 208 bytes in an ECC column. Although only one of the 16 bytes in the DRAM interface are used, most of the accesses are DRAM page hits. Thus performance is sufficient even though the wide DRAM interface is not useful in the ECC column direction.

After all 208 bytes in the ECC columns have been read, the pointer is reset to the start of the next ECC column. While the previous ECC column is being read, the starting pointer from start register 80 is incremented by one byte by adder 84. This moves the pointer to the start of the second ECC column, which is one byte to the right in the memory-block row. The updated starting pointer from start register 80 is copied to pointer register 86 at the end of each ECC-column fetching. Then fetching continues with the next ECC column by incrementing the pointer by 16 bytes for each of a total of 208 reads.

The first 16 ECC columns are located across the first memory-block row. However, the next 16 ECC columns are located in the second memory-block row. While the 16$^{th}$ ECC column (column 15) begins at the 16$^{th}$ byte of the first memory-block row, the 17$^{th}$ ECC column (column 16) begins at the 1$^{st}$ byte of the second memory-block row. This is seen by comparing the positions of bytes (0,15) and (0,16) in data block 22 of FIG. 9. The starting bytes of the 16$^{th}$ and 17$^{th}$ ECC columns thus differ by 208*16-15 bytes, which is 3313 bytes. After each 16 ECC columns, the starting pointer is incremented by 3313 bytes rather than 1 byte. Adder 84 increases the starting pointer from start register 80 by 3313 rather than 1 when the ECC column is a modulo-16 column (every 16$^{th}$ ECC-column end). This moves the pointer for the start of the current ECC column down.

The starting bytes of all ECC columns are in ECC row 0, which is stored in the first 16 columns of the memory block. In FIG. 9, these ECC-column starting bytes begin with byte (0,0) and end with byte (0,181). As each ECC column is read, the 208 ECC column bytes from (0,0), (1,0), . . . (207,0) are read for the first ECC column. Then the starting pointer is incremented by 1 so that the second ECC column is read from (0,1), (1,1), . . . to (207,1). The next ECC columns are read from the first memory-block row until the 16$^{th}$ ECC column is read from (0,15), (1,15), . . . to (207,15). Then the starting pointer is incremented by 3313 so that the 17$^{th}$ ECC column is read from the start of the second memory-block row at (0,16). The 17$^{th}$ ECC column is read as (0,16), (1,16), . . . to (207,16). The next 15 ECC columns are also read from the second memory-block row, through the 32$^{nd}$ ECC column: (0,31), (1,31), . . . to (207,31).

The starting pointer is again incremented by 3313 so that the next (33$^{rd}$) ECC column is read from the start of the third memory-block row at (0,32). The 33$^{rd}$ ECC column is read as (0,32), (1,32), . . . to (207,32). The next 15 ECC columns are also read from the third memory-block row, through the 48$^{th}$ ECC column: (0,47), (1,47), . . . to (207,47). The process continues until the last 6 ECC columns are read from the last memory-block row.

Figure 13:
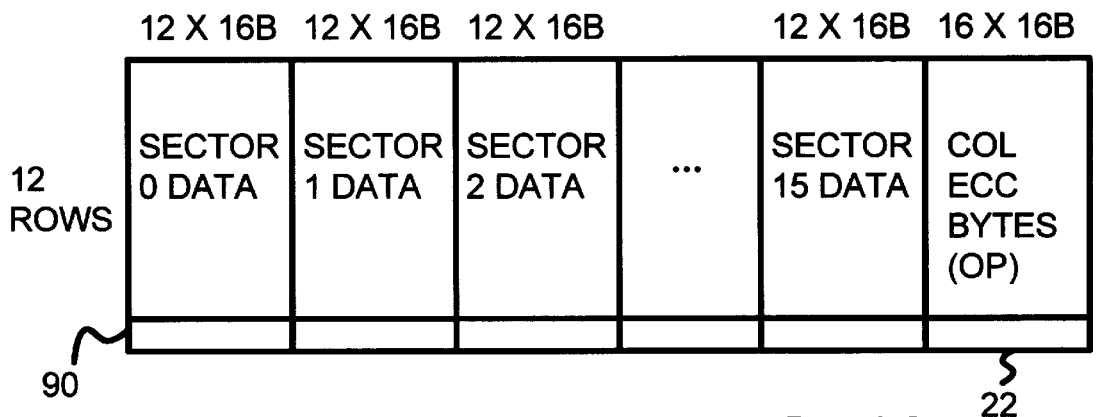
FIG. 13 illustrates how the ECC data block can be divided into sectors.

Sectors in ECC Block—FIG. 13

FIG. 13 illustrates how the ECC data block can be divided into sectors. Data block 22 contains 208 ECC rows and 182 ECC columns, but the ECC columns are mapped to memory-block rows, with 16 ECC columns stored in the memory-block rows. There are 12 memory-block rows.

Each memory-block column is 16 bytes wide, matching the width of the DRAM interface. Thus a memory-block column can be written in a single memory-access cycle. Every 12 ECC rows form a sector. Sectors are a lower-level logical data structure defined by the DVD specification. There are 16 sectors in an ECC block, and each sector contains 12 ECC rows. The host makes data requests for sectors rather than for the larger ECC blocks. Thus rapidly finding a sector in an ECC data block is important.

The invention's data arrangement provides easy access to sectors, since the sectors are not jumbled up. Instead, each sector is stored as 12 continuous ECC rows, in 12 memory-block columns that are 16-bytes wide. Locations of sectors can easily be calculated as multiples of 12 memory-block columns. High-bandwidth 16-byte fetches can be used to read data from a sector in order.

Figure 1:
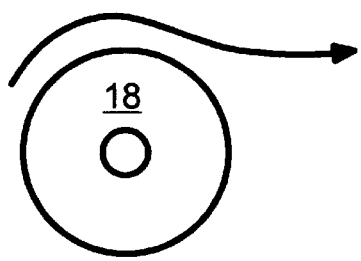
FIG. 1 illustrates a DVD data block with error correction for both rows and columns.
Figure 2:
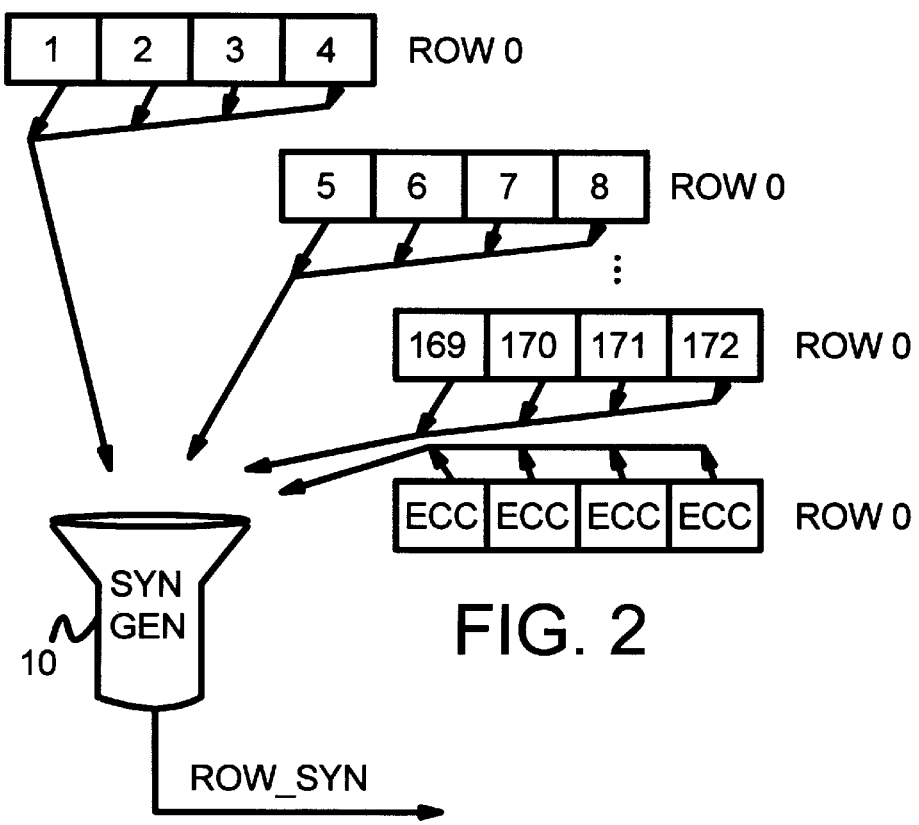
FIG. 2 highlights that multiple bytes can be fetched from buffer memory for row syndrome generation.
Figure 3:
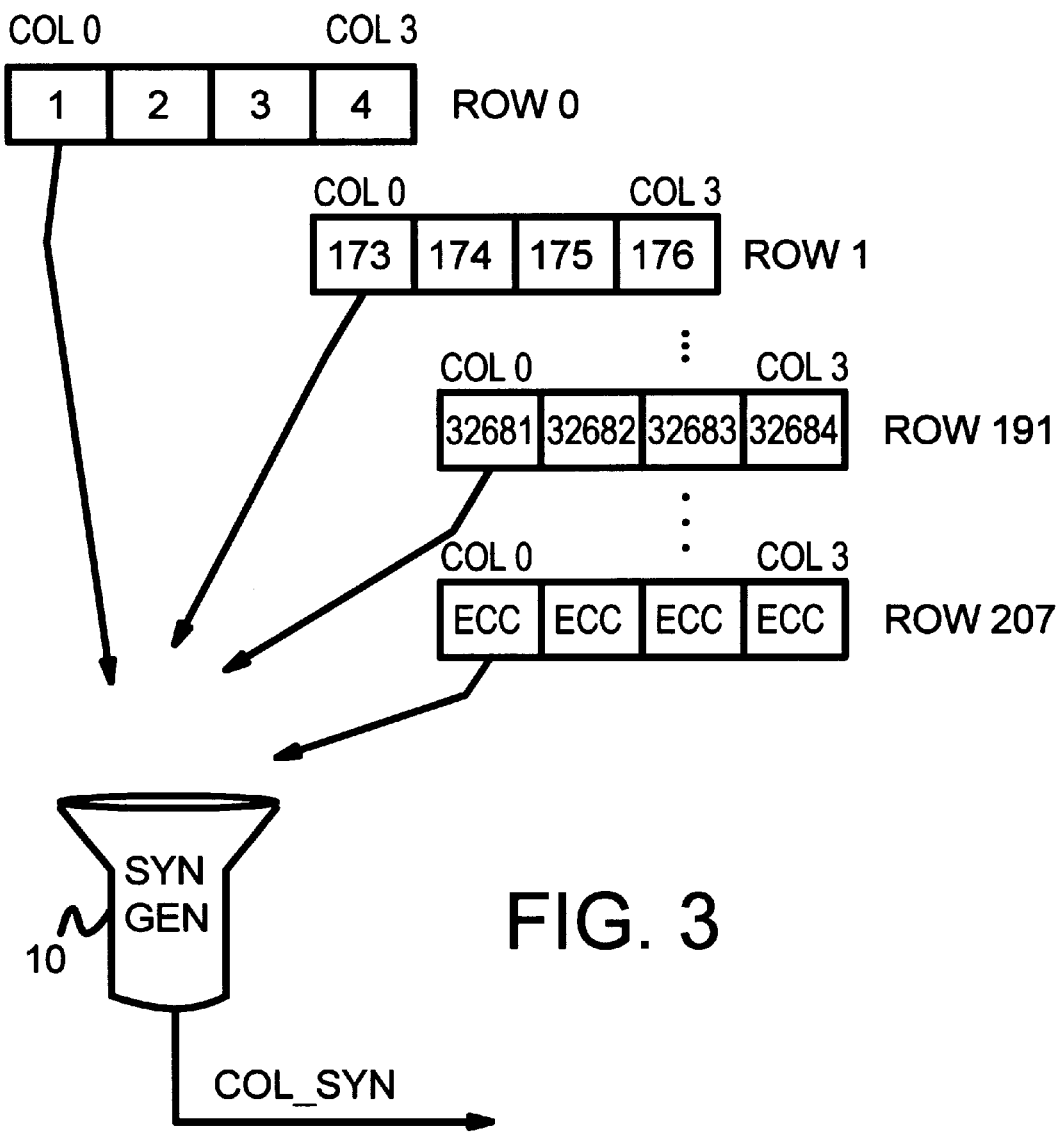
FIG. 3 highlights that column-syndrome generation uses inefficient single-byte fetches.

After the 16 sectors, the last 16 ECC rows contain the ECC error-correction bytes for the columns. These 16 ECC rows are not located on the optical disk at the end of the ECC block as shown in FIG. 1. This would allow a single physical disk error to wipe out all the column error correction information. Instead the column ECC information is interleaved with the sectors. Each of the 16 sectors has 12 ECC rows of data, and one ECC row of the column ECC bytes. As the data is read from the optical disk, the first 12 ECC rows of a sector are written to the sector's 12 memory-block columns, but the last ECC row is written to the end of the ECC block, in the last 16 memory-block columns. The last 16 memory-block columns thus contain one ECC row from each of the 16 sectors. Each of these 16 last memory-block columns contains only ECC bytes, not data bytes. These ECC bytes for column syndromes are sometimes known as outer parity (PO) while the 10 row ECC bytes at the end of each ECC row are known as inner parity (PI), since they are used for the first-pass error correction using the row syndromes.

The inner parity, the 10 row ECC bytes, are stored as the last 10 bytes in each ECC row. They are thus stored at the bottom of all memory-block columns. Each 16-byte wide column in the second-to-the-last memory-block row contains 12 data bytes and 4 inner-parity (row-ECC) bytes. Each 16-byte word in the last memory-block row 90 contains the other 6 inner-parity (row-ECC) bytes. The other 10 bytes in each 16-byte word of the last memory-block row 90 are written with the 10 row-syndrome bytes generated by the row syndrome generator.

Figure 14:
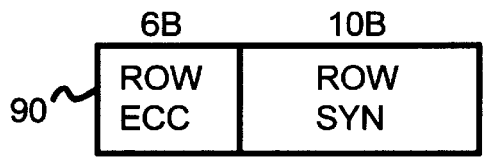
FIG. 14 shows that a 16-byte word at the bottom of each column in the memory block contains 6 inner-parity bytes and 10 row-syndrome bytes.

Unused Bytes Store Row Syndromes—FIG. 14

Since only 6 of the 16 bytes in the last memory row are written with data (inner parity) from optical disk 18, another 10 bytes are available for each ECC row. These 10 bytes are later written with the row syndrome, which is 10 bytes long. The row syndrome is generated on-the-fly as the data in the row is being written to the DRAM. The last DRAM write can be delayed until the row syndrome bytes are available, and then the six data bytes merged with the 10 syndrome bytes and written together in a 16-byte write cycle. Otherwise, the row syndrome bytes can be written later using byte-enables to write only the last 10 bytes.

FIG. 14 shows that a 16-byte word at the bottom of each column in the memory block contains 6 inner-parity bytes and 10 row-syndrome bytes. Each 16-byte word in last memory-block row 90 contains 6 bytes of inner parity (the row ECC bytes at the end of each ECC row). Another 10 bytes are available for the row syndromes for the ECC row, once they are generated by the row-syndrome generator. Thus the row syndromes are stored next to the row itself, allowing simplified access by error-correction logic.

ADVANTAGES OF THE INVENTION

Page-mode access is provided for ECC-column fetching, despite the non-continuous nature of the columns. This page-mode access is much faster than page-miss accesses. All the 37,857 bytes in the ECC block must be read individually for column-syndrome generation after row corrections are completed. Thus performance of column-syndrome generation is improved. Even though the physical DRAM rows may be smaller than the memory-block rows, most of the accesses are within a DRAM page, and about 95% of the column fetches are DRAM page hits.

The wide embedded DRAM interface allows 16 bytes to be read or written simultaneously in a single memory-access cycle. This wide interface is used to advantage for writes from the optical disk, and host transfers. The data rates from the optical disk and to the host are typically less than the data rates required for error correction. Page misses can be tolerated since data is accumulated from the optical disk prior to being written. A FIFO is often used to buffer data to the host, so again the higher latency of page-miss cycles can be tolerated.

While all the bytes in an ECC block can be fetched for row-syndrome generation, the inventor has realized that on-the-fly row-syndrome generation eliminates the need for fetching for row-syndrome generation. Thus the 37,857 bytes do not have to be fetched, saving over 2300 memory-access cycles. The data bytes are received directly from the optical disk in row order and are sent to both the embedded DRAM for writing and to the row-syndrome generator. The row-syndrome generator is thus able to generate the row syndromes as the bytes are received from the DVD optical disk, without re-fetching. The novel data arrangement is particularly well-suited for on-the-fly row-syndrome generation, since the critical row-syndrome generation does not have to access the memory. Only the critical column-syndrome generation needs fast DRAM access.

The invention is not limited to an exact physical DRAM arrangement, since each row in the memory-block can exist across several physical DRAM rows. The DRAM does not have to be constructed to the exact dimensions of the ECC data block, and the memory block could even be divided into separate sections that are managed by a memory-management unit (MMU), such as is commonly done by paging and segmentation by high-level operating systems.

A high-speed optical-disk playback system is facilitated by the inventor's data arrangement. An embedded DRAM buffer is used for error correction. Multi-byte fetches of a wide buffer memory are used as much as possible to improve memory efficiency and bandwidth available for other uses. A more efficient organization of the data in the embedded DRAM buffer is achieved. Performance of column syndrome generation and fetching is improved by improving the data arrangement in the buffer memory.

ALTERNATE EMBODIMENTS

Several other embodiments are contemplated by the inventor. For example FIFO buffers or pipeline latches can be inserted into the circuitry at many points, such as to and from the embedded memory. Other circuit implementations are possible. The addresses can be generated by a variety of hardware circuits or software or firmware routines and is not limited to the conceptual diagrams shown for illustration. Many variations of Reed-Solomon code can be used for the ECC bytes as the invention is not limited to a certain type of coding or error-correction methods. Different polynomial generators for the Reed-Solomon code can be used, as can different Galois fields. While the term byte has been used with reference to an 8-bit quantity, it should be realized that other data widths can be used. For example, it is possible that future DVD systems will operate on two or four-byte data words or fields. Each column is then the width of one data word or field.

While a four-byte or a 16-byte fetch or read from the buffer memory has been described, other fetch sizes can be used with the invention. With embedded memories in particular, larger fetch sizes are common. For example, a 128-bit (16-byte) interface is used by the assignee for an embedded memory in a graphics controller, and a 256-bit (32-byte) interface is contemplated. Such a wide interface is practical for embedded memories but not for external memories because package pins on the chip are not needed for the memory interface when embedded memories are used.

The fetch size is typically defined by the width in bytes of the interface between the memory and other circuits. Sometimes this width can vary, perhaps being larger for the host or disk interface but smaller for interfaces to ECC blocks. The full address does not have to be generated. Instead, the lower 4 address bits can be used as byte enables within the 16-byte fetch width of the embedded DRAM.

DRAM page hits are faster because data is read from a physical row in the DRAM that has already been accessed or opened. Its row line has already been charged. A page-miss cycle requires that the currently-open row line be discharged and a different row line be charged, before the data can be read out. Another type of page miss cycle occurs after a refresh or idle period, when none of the row lines are charged. Then the desired row line has to be charged. In traditional DRAMs, the row lines are accessed once the row portion of the address is strobed in using a RAS signal, while the data within the row is selected once the CAS line strobes in the column address, or the column address is changed. The invention is also useful with non-traditional DRAMs that have faster access times for intra-row or other localized accesses, and clocked or synchronous DRAMs can also be substituted.

Timing of the various pipelined blocks can be controlled by a central controller. Flags or bits can be set or cleared upon completion of tasks for a block, such as completion of reading from the DVD disk, completion of generation of all the row syndromes, row error correction, etc. DVD-RAMs that are writeable can be used when the invention is modified for writing as well as reading data from the disk. The invention may be adapted for future extensions of DVD or future optical disk standards. The invention can also be applied to non-computer DVD systems, such as consumer electronics DVD video players.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A buffer for buffering data from an optical disk to a host, the buffer comprising:

a disk interface, coupled to receive data from the optical disk, for outputting data words, the data from the optical disk arranged into disk blocks containing disk rows and disk columns;

a memory, coupled to receive the data words from the disk interface, for storing the disk blocks as memory blocks, wherein disk rows are stored in memory-block columns and disk columns are stored in memory-block rows; and a column-syndrome generator, coupled to the memory, for reading data in a disk column by reading a memory-block row from the memory, the column-syndrome generator outputting a column syndrome for the disk column, the column syndrome indicating when an error is present in the disk column;

whereby memory-block rows are read to generate column syndromes.

2. The buffer of claim 1 further comprising:

an accumulator, in the disk interface, for accumulating a series of n bytes of data into a data word before writing to the memory;

wherein the memory includes a wide interface, the wide interface able to write n bytes to the memory in a single memory-access cycle, whereby the wide interface is used for writing data words from the optical disk to the memory.

3. The buffer of claim 2 wherein the memory-block columns are n bytes in width, wherein data from the optical disk is written as n bytes to a first memory-block row, a next n bytes to a second memory-block row, and each following n bytes to one of a plurality of following memory-block rows;

wherein each of the n bytes is written to a same n byte wide memory-block column, whereby multiple bytes of data from the optical disk are written to each memory-block row.

4. The buffer of claim 3 wherein n is 16, and the wide interface is 16 bytes in width.

5. The buffer of claim 3 wherein the column-syndrome generator reads a single byte from each disk row using a separate memory-access cycle for each byte in the disk column, whereby the column-syndrome generator does not use all bytes of the wide interface.

6. The buffer of claim 3 wherein the memory is a dynamic random-access memory DRAM having a faster access time for a page-hit wherein a last access was to a same DRAM row as a current access than when the last access was a page-miss to a different DRAM row than the current access;

wherein memory-access cycles for the disk interface are mostly page-miss cycles that require more time than page-hit cycles;

wherein memory-access cycles for the column-syndrome generator are mostly page-hit accesses, whereby page hits occur for column-syndrome fetching but not for disk-interface accesses.

7. The buffer of claim 6 wherein each memory-block row contains several DRAM pages;

wherein page-hit cycle occur when fetching by the column-syndrome generator within a DRAM page, but a page-miss cycle occurs when the column-syndrome generator fetches from a new DRAM page, whereby memory-block rows contain several DRAM pages.

8. The buffer of claim 3 wherein data is read from the optical disk in row order, wherein data in one disk row is received before data in a next disk row is received.

9. The buffer of claim 8 further comprising:

a host interface, coupled to the memory, for transferring data to the host, the host interface fetching data using all bytes in the wide interface, but page-miss cycles occur as data is sequentially read out of the memory by host interface, whereby the host interface uses the wide interface but not page mode.

10. The buffer of claim 3 further comprising:

a row-syndrome generator, coupled to the disk interface, for receiving the data from the optical disk and generating a row syndrome for each disk row, whereby the row syndrome is generated on-the-fly.

11. The buffer of claim 10 wherein the row-syndrome generator does not read from the memory, whereby fetching for row-syndrome generation is avoided.

12. The buffer of claim 10 a syndrome writer, coupled to the row-syndrome generator, for writing the row syndrome to the memory, whereby the row syndrome is written to the memory.

13. The buffer of claim 12 wherein the syndrome writer writes the row syndrome to a same memory-block column that contains a disk row that the row syndrome is generated from, whereby the row syndrome is stored with the disk row.

14. The buffer of claim 13 wherein the syndrome writer is coupled to the disk interface, the disk interface writing last bytes in a disk row with the row syndrome in a single memory access, whereby the row syndrome is generated and written to the memory as the last bytes in the disk row is written.

15. The buffer of claim 3 wherein the optical disk is a digital-versatile disk (DVD) optical disk;

wherein the disk block contains 208 disk rows and 182 disk columns.

16. The buffer of claim 15 wherein the disk block contains 16 sectors, each sector having 12 disk rows and an column-error row, the 12 disk rows being written to 12 contiguous memory-block columns in the memory, but the column-error row being written to a separate 16-column region of the memory block containing the column-error rows from the 16 sectors, whereby the column-error rows are interleaved with the sectors.

17. The buffer of claim 15 wherein each disk row contains 172 data bytes and 10 inner-parity bytes, the inner-parity bytes used by a row-syndrome generator for detecting errors in each disk row.

18. A digital-versatile disk (DVD) controller comprising:

a disk interface, coupled to receive uncorrected data words read from an optical disk as a series of disk rows that form a disk block;

a buffer memory, coupled to receive the uncorrected data words from the disk interface, for storing the uncorrected data words as a memory block having data words and error-correction words for the data, the block including memory-block rows and memory-block columns;

wherein the data words in a disk row are written to a memory-block column, the memory block being rotated from the disk block;

a row-syndrome generator, coupled to receive the uncorrected data words directly from the disk interface, for generating a row syndrome for each row in the block, the row-syndrome generator outputting a row syndrome for detecting errors in the row;

a column-syndrome generator, coupled to the buffer memory, for reading data words of a disk column by reading a memory-block row in the buffer memory from all memory-block columns in the block, the column-syndrome generator having registers for storing a column syndrome, the column syndrome for detecting errors in the column; and an error corrector, reading the row syndrome, for detecting an error in the disk row by examining the row syndrome, the error corrector locating and correcting an error detected in the disk row by writing to the memory-block column containing the disk row in the buffer memory, whereby the column syndrome is generated by reading data words from the memory-block row in the buffer memory.

19. The DVD controller of claim 18 wherein the column-syndrome generator uses page-hit accesses but not a full width of a wide interface to the buffer memory, but the disk interface writes all bytes of the full width of the wide interface, but has page-miss accesses to the buffer memory, whereby the disk columns are arranged into physical pages but are orthogonal to the wide interface, while the disk rows are orthogonal to the physical pages but use the full width of the wide interface.

20. A method of buffering data from an optical digital-versatile disk (DVD) disk to a host, the method comprising:

reading a block of data from the DVD disk as a data stream from the DVD disk;

accumulating a first group of x bytes from the data stream;

writing the group of x bytes in a single memory-access cycle to a first row in a first column in a buffer memory;

accumulating a second group of x bytes from the data stream;

writing the second group of x bytes in a single memory-access cycle to a second row in the first column in the buffer memory;

continuing to accumulate groups of x bytes and writing each group of x bytes to a different row in the first column in the buffer memory;

accumulating additional groups of x bytes from the data stream and writing in a similar fashion to other columns in the buffer memory;

generating a row syndrome from all bytes written to a column in the buffer memory;

correcting a disk-row error by using the row syndrome to locate the disk-row error in a column of the buffer memory and correcting other disk-row errors using row syndromes to produce a row-corrected block;

generating a column syndrome for a first disk-column by:

initializing a pointer to a first byte from the first column and first row of the buffer memory;

reading a byte located by the pointer;

accumulating in a column-syndrome generator the byte into a first column syndrome;

increasing the pointer by x, wherein a single memory-access cycle can write x bytes from the optical disk;

reading a byte located by the pointer from the first row of the buffer memory using a page-hit memory cycle;

accumulating in a column-syndrome generator the byte into a first column syndrome;

continuing to increase the pointer by x and read and accumulated the byte;

generating other column syndromes in a similar manner after initializing the pointer to a first byte in different disk-column;

using the column syndromes in an error corrector to detect, evaluate, locate, and correct any errors in a disk-column;

wherein after all disk-columns have been corrected the row-corrected block becomes a row-and-column-corrected block;

transferring the row-and-column-corrected block to a host, whereby disk-rows are written to columns of the buffer memory.

* * * * *